United States Patent
Kim et al.

(10) Patent No.: US 11,255,886 B2
(45) Date of Patent: Feb. 22, 2022

(54) CURRENT MEASUREMENT APPARATUS INCLUDING CHARGE/DISCHARGE MEANS AND CURRENT MEASUREMENT METHOD USING SAME

(71) Applicant: Byung Kyu Kim, Gyeonggi-do (KR)

(72) Inventors: Byung Kyu Kim, Seongnam-si (KR); Byeong Yun Kim, Seoul (KR)

(73) Assignee: PHOSPHIL INC., Seoul (KR)

( * ) Notice: Subject to any disclaimer, the term of this patent is extended or adjusted under 35 U.S.C. 154(b) by 268 days.

(21) Appl. No.: 16/611,337

(22) PCT Filed: May 17, 2018

(86) PCT No.: PCT/KR2018/005668
§ 371 (c)(1),
(2) Date: Nov. 6, 2019

(87) PCT Pub. No.: WO2018/216954
PCT Pub. Date: Nov. 29, 2018

(65) Prior Publication Data
US 2020/0081039 A1 Mar. 12, 2020

(30) Foreign Application Priority Data
May 24, 2017 (KR) .......................... 10-2017-0064155

(51) Int. Cl.
*G01R 19/00* (2006.01)
*G01R 31/50* (2020.01)
(Continued)

(52) U.S. Cl.
CPC ........... *G01R 19/0092* (2013.01); *G01R 1/36* (2013.01); *G01R 31/016* (2013.01); *G01R 31/3183* (2013.01); *G01R 31/50* (2020.01)

(58) Field of Classification Search
CPC .... G01R 19/0092; G01R 1/36; G01R 31/016; G01R 31/3183; G01R 31/50;
(Continued)

(56) References Cited

U.S. PATENT DOCUMENTS

| | | | |
|---|---|---|---|
| 2021/0257920 A1* | 8/2021 | Cheng | H02M 3/33523 |
| 2021/0258519 A1* | 8/2021 | Niwa | H04N 5/351 |
| 2021/0342660 A1* | 11/2021 | Wu | G06K 19/0717 |

FOREIGN PATENT DOCUMENTS

| | | |
|---|---|---|
| CN | 106597063 | 4/2017 |
| JP | 2003167025 | 6/2003 |

(Continued)

OTHER PUBLICATIONS

Chinese Office Action—Chinese Application No. 201880031834.5 dated Apr. 2, 2021, citing CN 106597063.
(Continued)

*Primary Examiner* — Giovanni Astacio-Oquendo
(74) *Attorney, Agent, or Firm* — Cantor Colburn LLP (57) ABSTRACT

A current measurement apparatus comprises: a capacitor connected in parallel to a signal terminal of a device under test (DUT); a test pattern generation apparatus generating a test pattern to operate the DUT; and a measurement module connected to one end of the capacitor. The measurement module comprises: an input/output (I/O) buffer increasing or reducing an amount of charges of the capacitor and outputting a signal corresponding to an output logic value according to a voltage of the one end of the capacitor; a time measurer measuring an arrival time which it takes for the voltage of the one end of the capacitor to reach a second voltage from a first voltage; and a controller controlling the i/o buffer and the time measurer to measure the arrival time and controlling such that a value of a current related to an inspection of a DUT is measured using the arrival time.

16 Claims, 3 Drawing Sheets

(51) Int. Cl.
*G01R 1/36* (2006.01)
*G01R 31/01* (2020.01)
*G01R 31/3183* (2006.01)

(58) Field of Classification Search
CPC .......... G01R 31/3012; G01R 19/16533; G01R 19/25; G01R 31/31713; G01R 31/31725
USPC ...................................... 324/76.11, 600, 713
See application file for complete search history.

(56) References Cited

FOREIGN PATENT DOCUMENTS

| | | |
|---|---|---|
| JP | 2003172761 | 6/2003 |
| JP | 2010190768 | 9/2010 |
| KR | 20000047865 | 7/2000 |
| KR | 20110034580 | 4/2011 |
| KR | 20140034171 | 3/2014 |

OTHER PUBLICATIONS

International Search Report—PCT/KR2018/005668 dated Sep. 5, 2018.

* cited by examiner

CURRENT MEASUREMENT APPARATUS INCLUDING CHARGE/DISCHARGE MEANS AND CURRENT MEASUREMENT METHOD USING SAME

CROSS-REFERENCE TO RELATED APPLICATIONS

This application is a national entry of PCT Application No. PCT/KR2018/005668 filed on May 17, 2018, which claims priority to and the benefit of Korean Application No. 10-2017-0064155 filed on May 24, 2017, in the Korean Patent Office, the entire contents of which are incorporated herein by reference.

TECHNICAL FIELD

This invention relates to a current measurement apparatus for measuring a current related to an inspection of a device under test (DUT) so as to perform an inspection for the DUT, e.g., an electrical and electronic circuit module, a semiconductor device, or the like, which is a subject for current measurement. Specifically, this invention relates to an apparatus which is a current measurement tool for an electronic device having an electronic circuit such as an electronic device, a semiconductor element, a circuit module, a circuit board, or the like.

BACKGROUND ART

As the conventional current measurement tool for performing current measurement on device under tests (DUTs) for electric and electronic circuit modules such as integrated circuit (IC) drivers, semiconductor devices, and the like, an apparatus to which a method of measuring a voltage using a coil, a resistor, or the like and then measuring a current using the voltage is applied is widely used.

For example, such a kind of current measurement tool includes a current measurement apparatus disclosed in Korean Patent Laid-Open Application No. 10-2014-0034171. The current measurement apparatus of Related Art Document uses a class-D amplifier 14 which is a precision amplifier, and a coil and a resistor 16 and 17 (see FIG. 1 of Related Art Document). To briefly describe the principle of the current measurement apparatus, a voltage value is converted into a value of a current from a variation in magnetic field induced in the coil or from the physical law $I=V/R$ (here, I indicates the current value, V indicates the voltage value, and R indicates a resistance value).

A problem of such a method is that, since these conventional current measurement tools should use significantly expensive precision amplifiers and bulky coils and resistors, a size of the current measurement apparatus is increased, and current losses in the coils and the resistors included in the current measurement apparatus are not negligible so that a control method for compensating for the current losses should be added.

Figure 1:
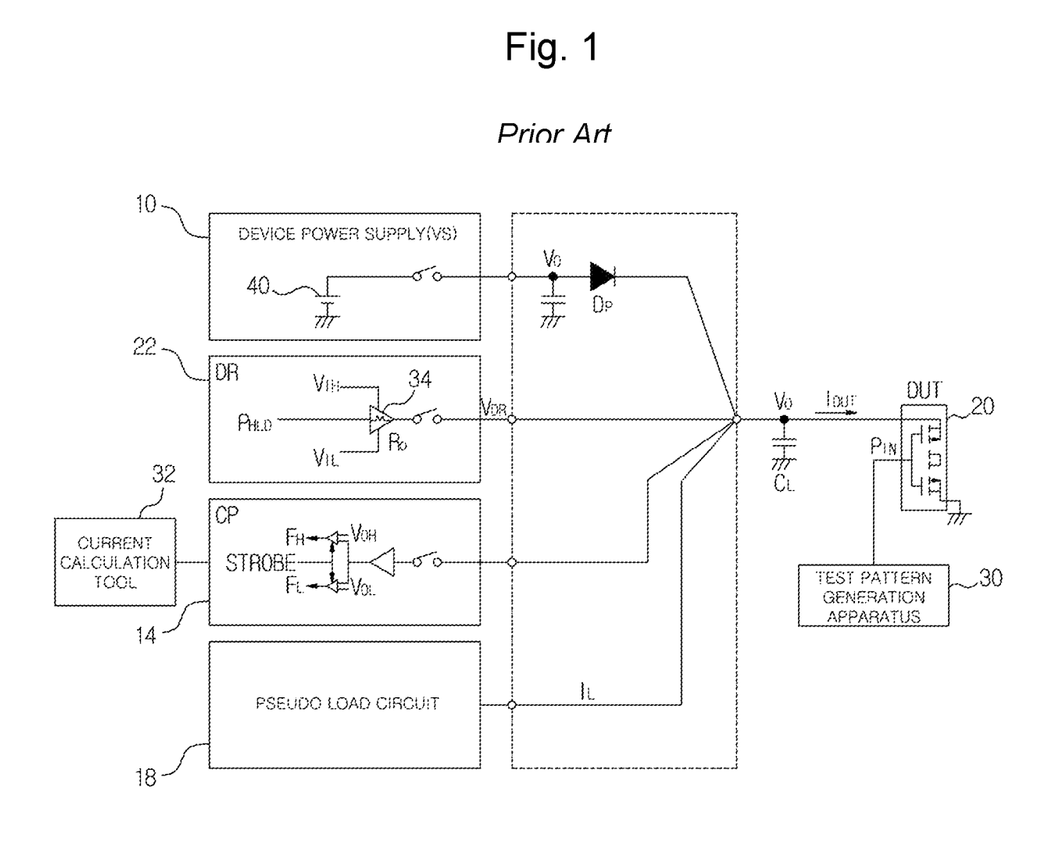
FIG. 1 is an exemplary diagram illustrating a conventional current measurement apparatus which measures a current of a device under test (DUT), using a precision driver and a precision comparator, by charging a capacitor without using a coil and a resistor.

In order to solve such a problem, a current measurement tool employing a method of measuring a current of a DUT by charging a capacitor without using a coil and a resistor includes a current measurement apparatus disclosed in Korean Patent Laid-Open Publication No. 2000-0047865. FIG. 1 is such a type of current measurement apparatus and is an exemplary diagram illustrating the conventional current measurement apparatus which measures a current of a DUT by charging a capacitor without using a coil and a resistor and using a precision driver and a precision comparator.

Since the current measurement apparatus of Related Art Document should use the precision driver and the precision comparator so as to measure a variance in voltage of the capacitor, there is a problem in that a manufacturing unit cost increases and a manufacturing area increases, so a practical application is still limited.

SUMMARY OF INVENTION

Technical Problem

The present invention is directed to providing a new current measurement tool which is capable of solving these problems and reducing a unit cost as well as being suitable for miniaturization due to not using precision parts such as coils, resistors, current amplifiers, precision comparators, and high-speed analog-to-digital converters (ADCs).

Solution to Problem

The characteristic constitution of the present invention for achieving the above-described objectives of the present invention and realizing the characteristic effects thereof, which will be described below, is as follows.

One aspect of the present invention provides a current measurement apparatus including a capacitor connected in parallel to a signal terminal of a device under test (DUT) which is a subject for current measurement, a test pattern generation apparatus configured to generate a test pattern to operate the DUT, and a measurement module connected to one end of the capacitor which is connected to the signal terminal of the DUT, wherein the measurement module includes an input/output (I/O) buffer configured to increase or decrease an amount of charges of the capacitor through charging or discharging the capacitor and output a signal corresponding to an output logic value according to a voltage of one end of the capacitor, a time measurer configured to measure an arrival time which is a time during which the voltage of one end of the capacitor reaches a predetermined second voltage from a predetermined first voltage, and a controller configured to control the I/O buffer and the time measurer to measure the arrival time and measure a value of a current related to an inspection of the DUT using the arrival time.

According to one embodiment, the measurement module may measure at least one among (i) a value of a first leakage current flowing from the signal terminal of the DUT to a ground terminal thereof, (ii) a value of a second leakage current flowing from the signal terminal of the DUT to a power terminal thereof, (iii) a value of a first operating current flowing from the signal terminal of the DUT to the ground terminal thereof, and (iv) a value of a second operating current flowing from the signal terminal of the DUT to the power terminal thereof using a calculation on the basis of capacitance of the capacitor, the first voltage, the second voltage, and the arrival time as the value of the current related to the inspection of the DUT.

According to another embodiment, the test pattern generation apparatus may generate a first test pattern for maintaining the DUT in a standby state in which at least one of the first leakage current and the second leakage current is measurable or generate a second test pattern for maintaining the DUT in an active state in which at least one of the first operating current and the second operating current is measurable.

In the above-described embodiments, the first voltage may be a voltage at which one end of the capacitor reaches when a driving voltage of the I/O buffer is applied to the capacitor for a time obtained by multiplying a time constant of a charging circuit including the capacitor and the I/O buffer by a predetermined positive number.

According to still another embodiment, the I/O buffer may be configured such that the first voltage and the second voltage are settable using various semiconductor elements, and, when the voltage of one end of the capacitor reaches to the second voltage from the first voltage, the I/O buffer may cause a variation in the output logic value to occur so that the time measurer detects the variation and the I/O buffer may instruct the time measurer to measure the arrival time.

According to an example of another embodiment, the current measurement apparatus may further include a protection circuit connected in parallel to one end of the capacitor and the measurement module, and the protection circuit may be a circuit for protecting the current measurement apparatus from at least one of an overcurrent and an electric shock.

Meanwhile, the current measurement apparatus may further include a switching element connected between one end of the capacitor connected in parallel to the measurement module and the signal terminal of the DUT. In this case, the controller may open or close the switching element according to a start time of the charging or discharging.

According to an example of still another embodiment, in the current measurement apparatus, at least one of capacitance of the capacitor and a measurement frequency of the time measurer may be variable so as to adjust precision of measurement for the value of the current of the DUT.

According to any one embodiment, in the current measurement apparatus, the measurement module may be formed such that the I/O buffer and the time measurer are monolithically integrated into the controller.

In addition to the above description, another aspect of the present invention provides a method of manufacturing a current measurement apparatus according to the above-described embodiments.

Further, another aspect of the present invention provides a measurement module, which is connected to one end of a capacitor connected to a signal terminal of a device under test (DUT) to measure a value of a current related to an inspection of the DUT, which is a subject for current measurement, in a state in which the signal terminal of the DUT is connected in parallel to the capacitor and the DUT operates due to a test pattern, the measurement module including an input/output (I/O) buffer configured to increase or decrease an amount of charges of the capacitor through charging or discharging the capacitor and output a signal corresponding to an output logic value according to a voltage of one end of the capacitor, a time measurer configured to measure an arrival time which is a time during which the voltage of one end of the capacitor reaches a predetermined second voltage from a predetermined first voltage, and a controller configured to control the I/O buffer and the time measurer to measure the arrival time and measure the value of the current related to the inspection of the DUT using the arrival time.

Still another aspect of the present invention provides a method of measuring a value of a current related to an inspection of a device under test (DUT), which is a subject for the current measurement, using a current measurement apparatus, the method including (a) in a state in which a signal terminal of the DUT is connected in parallel to a capacitor, a switching element is connected in series between one end of the capacitor and the signal terminal of the DUT, and the switching element is opened, (i) generating, by the current measurement apparatus, a test pattern to operate the DUT in a standby state or an active state or assisting a test pattern generation apparatus interlocked with the current measurement apparatus to operate and (ii) increasing or decreasing, by the current measurement apparatus, the amount of charges of the capacitor through charging or discharging the capacitor such that a voltage of one end of the capacitor reaches a predetermined first voltage, (b) when the voltage of one end of the capacitor reaches the first voltage, closing, by the current measurement apparatus, the switching element such that a variation in amount of charges of the capacitor begins, (c) when it is detected that the voltage of one end of the capacitor is varied to a predetermined second voltage, obtaining, by the current measurement apparatus, an arrival time which is a time elapsed from the closing time of the switching element to the variation to the predetermined second voltage, and (d) measuring, by the current measurement apparatus, the value of the current related to the inspection of the DUT using the obtained arrival time.

According to one embodiment, in operation (c), the variation of the voltage of one end of the capacitor to the predetermined second voltage may be detected using an I/O buffer connected to the one end of the capacitor connected to the signal terminal of the DUT, and the I/O buffer may output a signal corresponding to an output logic value according to the voltage of one end of the capacitor and detect, when the voltage of one end of the capacitor reaches the second voltage from the first voltage, a variation to the second voltage may be detected as a variation in the output logic value occurs.

In the present embodiment, the acquisition of the arrival time may be performed by a time measurer, and when the variation to the second voltage is detected from a controller, which controls the I/O buffer, or the I/O buffer, the time measurer may perform a function of measuring a time elapsed from when the switching element is closed to when the variation reaches to the second voltage.

Advantageous Effects of Invention

According to the embodiments of the present invention, a method of measuring a current using time measurement elements is employed. Thus, the present invention does not rely on expensive precision devices constituting hardware as in the conventional method or does not employ large parts such as coils, resistors, and the like such that there is an effect in that a unit cost can be reduced and miniaturization is possible.

Further, according to the embodiments of the present invention, unlike the conventional current measurement method in which a coil, a resistor, and the like are connected in series so that an electronic circuit in a device under test (DUT) needs to be modified, the current measurement apparatus or a terminal of a measurement module according to the present invention is connected in parallel to a terminal of the DUT so that measurement of a current is possible. Consequently, there is also an effect in that the current measurement of internal electronic circuits of the DUT, such as a semiconductor circuits, a module, and the like is possible without modification of the circuits.

Further, according to the embodiments of the present invention, a measurement time and precision of the measurement can be appropriately traded off by varying capacitance of the capacitor, a measurement frequency of the time measurer, and the like such that there is an effect which is capable of meeting various needs of users for the current measurement apparatus.

BRIEF DESCRIPTION OF DRAWINGS

The accompanying drawings, which are attached to be used in the description of the embodiments of the present invention, are merely some of the embodiments of the present invention, and may be used to those skilled in the art (hereinafter, as a "skilled person") to which the present invention pertains. Other drawings may be obtained on the basis of these accompanying drawings without inventive work being made.

DETAILED DESCRIPTION OF EMBODIMENT

In the following detailed description of the present invention, in order to clarify the objectives, technical solutions and advantages of the present invention, reference is made to the accompanying drawings that illustrate, by way of illustration, specific embodiments in which the present invention may be practiced. These embodiments are described in sufficient detail to enable a skilled person to practice the present invention. However, specific structural and functional descriptions of the embodiments of the present invention according to the concept and principle thereof disclosed herein are illustrative only for the purpose of describing the embodiments according to the present invention, and these embodiments according to the concept of the present invention may be implemented in various forms and should not be construed as being limited to the embodiments described herein.

Further, throughout the description and claims of the present invention, the term "comprising" and variations thereof are not intended to exclude other technical features, additives, components, or steps. Other objectives, advantages, and features of the present invention will become apparent to a skilled person, in part from this description and in part from the practice of the present invention. The following examples and drawings are provided by way of illustration and are not intended to limit the present invention.

Further, throughout the description and claims of the present invention, terms a "first," a "second," and the like may be used to describe various components, but the components should not be limited to the above terms. These terms may be used only for the purpose of distinguishing one component from another component, and, for example, a "first" component may be referred to as a "second" component, and similarly, the "second" component may also be referred to as the "first" component without departing from the scope of the present invention.

Further, when a component is referred to as being "connected," or "coupled" to another component, it may be directly connected or coupled to another component, but it should be understood that still another component may be present between the component and another component. On the contrary, when a component is referred to as being "directly connected," or "directly coupled" to another component, it should be understood that still another component may be absent between the component and another component. Other expressions describing the relationship between components, e.g., "between" and "immediately between," or "adjacent to" and "directly adjacent to" should also be construed as described above.

Further, the present invention encompasses all possible combinations of the embodiments described herein. It should be understood that various embodiments of the present invention, although different, are not necessarily mutually exclusive. For example, specific forms, structures, and characteristics described herein in connection with one embodiment may be implemented within other embodiments without departing from the spirit and scope of the present invention. Further, it should be understood that the location or arrangement of individual elements within each disclosed embodiment may be modified without departing from the spirit and scope of the present invention. The following detailed description, therefore, is not to be taken in a limiting sense, and the scope of the present invention is defined only by the appended claims, appropriately interpreted, along with the full range of equivalents to which the claims are entitled. In the drawings, similar numerals refer to the same or similar functionality throughout the several views.

Unless otherwise indicated herein or clearly contradicted by context in this disclosure, an item referred to as the singular encompasses the plural unless the context otherwise requires. Also, in the following description of the present invention, if a detailed description of related known configurations or functions is determined to obscure the gist of the present invention, the detailed description thereof will be omitted.

Hereinafter, exemplary embodiments of the present invention will be described in detail with reference to the accompanying drawings so as to enable a skilled person to easily practice the present invention.

Figure 2:
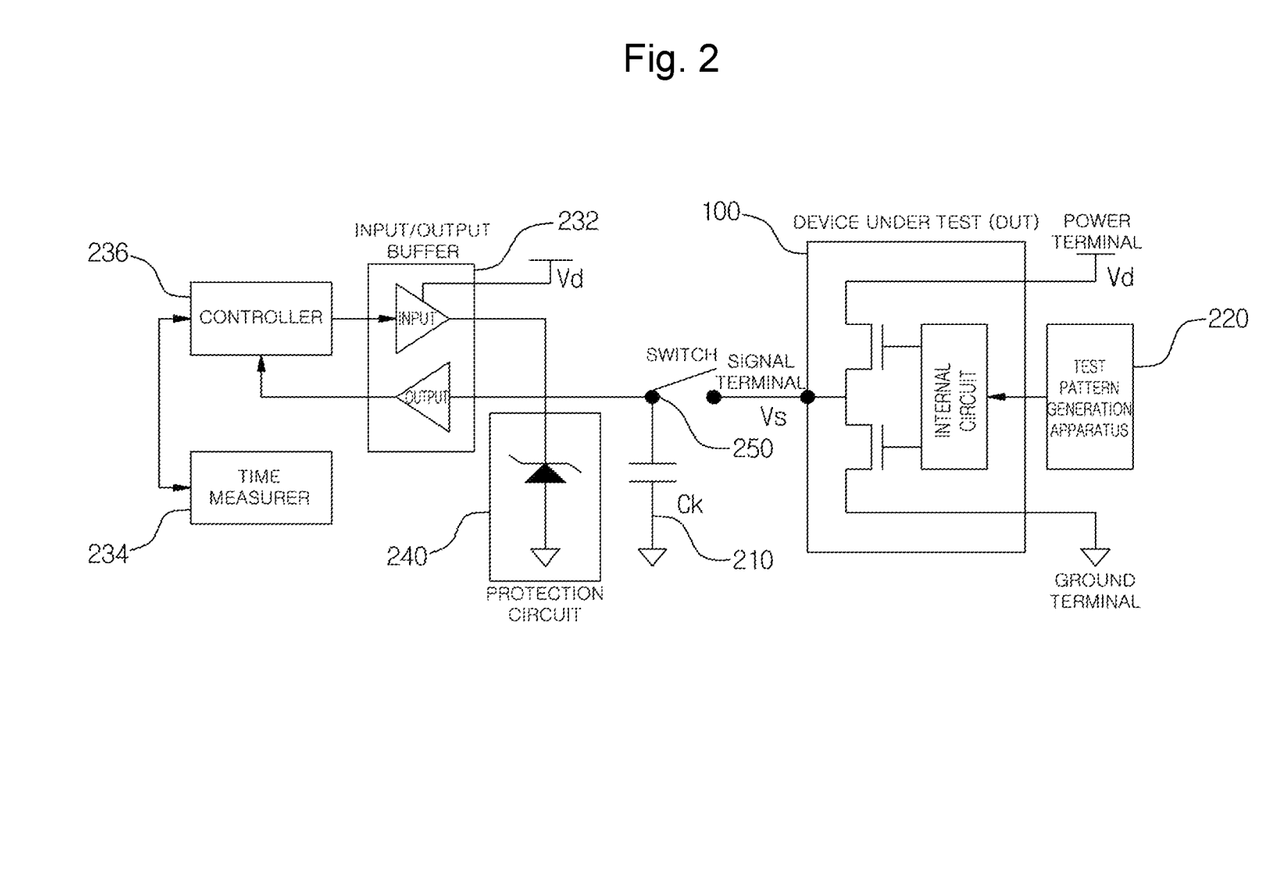
FIG. 2 is a schematic block diagram illustrating a current measurement apparatus according to one embodiment of the present invention.

FIG. 2 is a schematic block diagram illustrating a current measurement apparatus according to a first embodiment of the present invention.

Referring to FIG. 2, a current measurement apparatus 200 according to the first embodiment of the present invention includes a capacitor 210 connected in parallel to a signal terminal of a device under test (DUT) 100 which is a subject for current measurement, a test pattern generation apparatus 220 for generating a test pattern to operate the DUT, and a measurement module 230 connected to one end of the capacitor 210 which is connected to the signal terminal of the DUT 100.

Specifically, the measurement module 230 includes an input/output (I/O) buffer 232 which increases or decreases an amount of charges of the capacitor 210 through charging or discharging the capacitor 210 and outputs a signal corresponding to a state of, e.g., 1 or 0, as an output logic value according to a voltage of one end of the capacitor.

An example of the I/O buffer 232 may include an input buffer as a voltage output device which is a charging and discharging part for increasing or decreasing an amount of charges of the capacitor 210 through charging or discharging the capacitor 210, and an output buffer as a device for outputting a signal corresponding to an output logic value according to a voltage of one end of the capacitor.

For example, when the voltage of one end of the capacitor is a predetermined first voltage, the output buffer may output a signal corresponding to a state of 1, and, when the voltage of one end of the capacitor is a predetermined second voltage, the output buffer may output a signal corresponding to a state of 0. In contrast, when the voltage of one end of the capacitor is the predetermined first voltage, the output buffer may output a signal corresponding to a state of 0, and, when the voltage of one end of the capacitor is the predetermined second voltage, the output buffer may output a signal corresponding to a state of 1.

An example of the I/O buffer 232 may be configured to enable setting of the first voltage and the second voltage. Accordingly, when the voltage of one end of the capacitor reaches the second voltage from the first voltage, may be configured to generate a variation in output logic value.

In addition, the measurement module 230 further includes a time measurer 234 for measuring an arrival time which is a time during which a voltage of one end of the capacitor 210 reaches a predetermined second voltage from a predetermined first voltage. In other words, the time measurer detects a time at which an output logic value of the output buffer included in the I/O buffer 232 is varied and measures the detected time as an arrival time.

In this case, for example, when a driving voltage of the I/O buffer 232 is applied to the capacitor 210 for a time obtained by multiplying a time constant of a charging circuit including the capacitor 210 and the I/O buffer 232 by a predetermined positive number, the first voltage may be a voltage at which one end of the capacitor 210 reaches. In general, a settling time during charging is known to be about four times the time constant. Consequently, the skilled person may designate the predetermined positive number as four.

The skilled person will appreciate that, when the capacitor 210 is charged, the voltage of one end of the capacitor 210 may reach the predetermined second voltage that is higher than the first voltage, and, when the capacitor 210 is discharged, the voltage of one end of the capacitor 210 may reach the predetermined second voltage that is lower than the first voltage.

In addition, the measurement module 230 further includes a controller 236 for controlling the I/O buffer 232 and the time measurer 234 to measure the arrival time and measure a value of a current related to an inspection of the DUT using the arrival time. For example, the controller 236 may control a start time and a stop time of at least one of charging and discharging by the I/O buffer 232 to measure the arrival time through the time measurer 234.

In another example of the above-described I/O buffer 232, the I/O buffer 232 may have three states of 1, 0, and Hi-Z. Here, Hi-Z refers to a state in which an output of the output buffer included in the I/O buffer 232 is in an OFF state. For example, the controller 236 may transit the output of the output buffer into the OFF state by controlling the charging or discharging by the I/O buffer 232 to be stopped.

As described above, the measurement module 230 including the above-described components may calculate a value of a current related to the inspection of the DUT 100 from capacitance of the capacitor 210, the first voltage, the second voltage, and the arrival time. Here, the value of the current related to the inspection of the DUT 100 refers to (i) a value of a first leakage current flowing from the signal terminal of the DUT to a ground terminal thereof, (ii) a value of a second leakage current flowing from the signal terminal of the DUT to a power terminal thereof, (iii) a value of a first operating current flowing from the signal terminal of the DUT to the ground terminal thereof, or (iv) a value of a second operating current flowing from the signal terminal of the DUT to the power terminal thereof. For example, such a function of calculating the value of the current may be generally performed by the controller 236, but the skilled person will appreciate that the present invention is not limited thereto.

In the measurement of the value of the current, the test pattern generation apparatus 220 may generate a test pattern for maintaining the DUT 100 in a standby state in which at least one of the first leakage current and the second leakage current may be measured to apply the test pattern to the DUT 100 and generate another test pattern for maintaining the DUT 100 in an active state in which at least one of the first operating current and the second operating current may be measured to apply the another test pattern to the DUT 100. Meanwhile, a specific calculation principle and a specific individual procedure of the value of the current will be described in detail below.

Referring to FIG. 2 again, the current measurement apparatus 200 (not shown) according to the present invention may further include a protection circuit 240 connected in parallel to one end of the capacitor 210 and the measurement module 230. The protection circuit 240 protects the current measurement apparatus 200 from an overcurrent, an electric shock, and the like. That is, when the current measurement apparatus according to the present invention is brought into contact with or separated from the signal terminal of the DUT, the protection circuit 240 may serve to protect the current measurement apparatus and the DUT from induced electrostatic discharge (ESD).

Further, the current measurement apparatus 200 may further include a switching element 250 which is connected in series between one end of the capacitor 210, the measurement module 230, and the protection circuit 240, which are connected in parallel with each other, and the signal terminal of the DUT 100. The controller 236 may open or close the switching element 250 according to a start time of charging or discharging of the capacitor 210.

Figure 3:
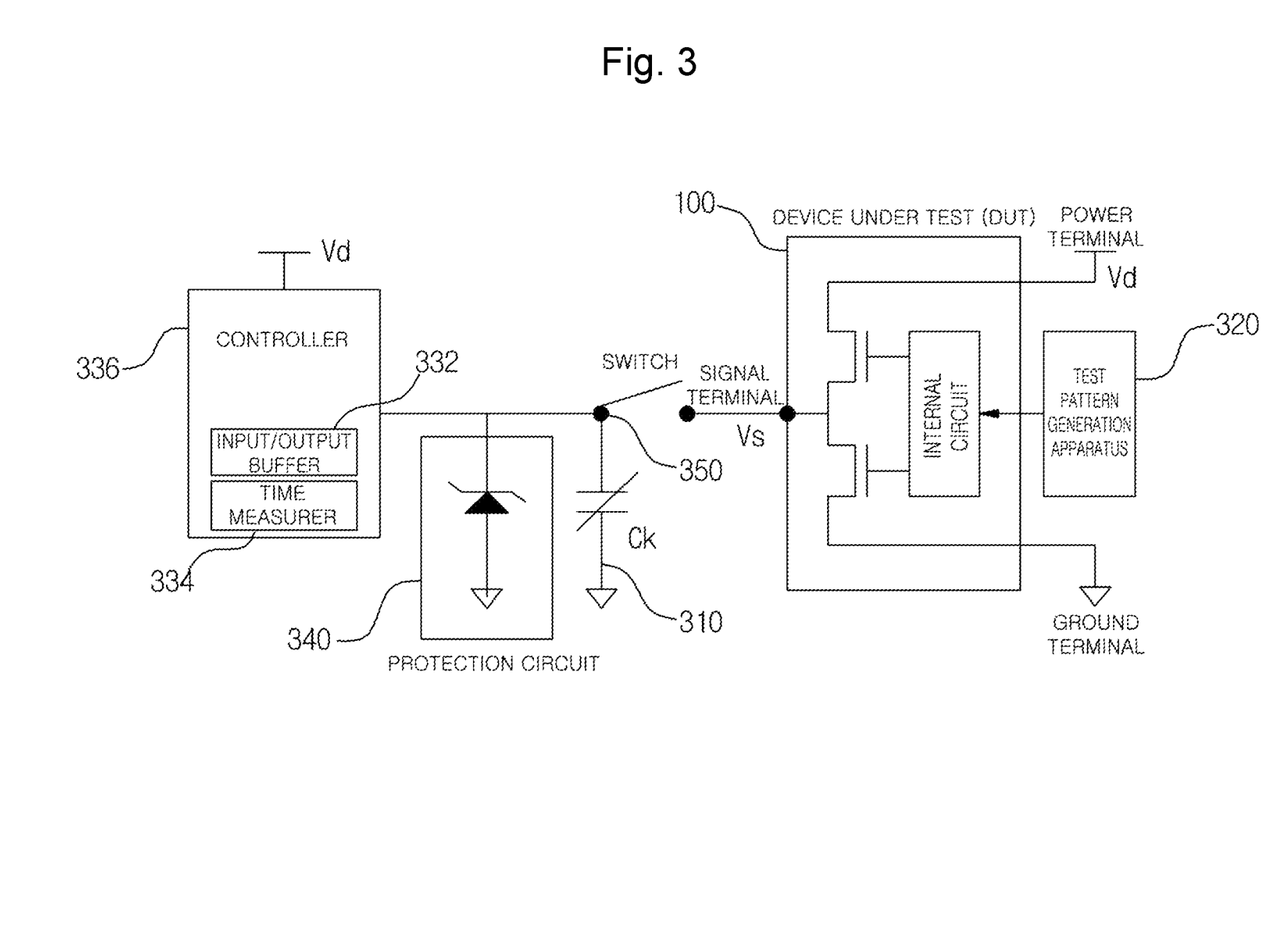
FIG. 3 is a schematic block diagram illustrating a current measurement apparatus according to another embodiment of the present invention in which an input/output (I/O) buffer and a time measurer in the embodiment shown in FIG. 2 are monolithically integrated into a controller.

Hereinbefore, an overview of the current measurement apparatus according to the first embodiment of the present invention is described with reference to FIG. 2. FIG. 3 is a schematic block diagram illustrating a current measurement apparatus according to a second embodiment of the present invention in which the I/O buffer and the time measurer in the embodiment shown in FIG. 2 are monolithically integrated into the controller.

Referring to FIG. 3, for example, a controller 336 may be comprised of field programmable gate arrays (FPGAs) having a bidirectional I/O function, a microprocessor, an application specific integrated circuit (ASIC), or the like to monolithically include an I/O buffer 332 and a time measurer 334.

In the above-described first embodiment and the second embodiment, a specific value of the current related to the inspection of the DUT 100 may be measured by a current value measurement method according to the present invention as follows.

For example, when the DUT 100 is a semiconductor device, two types of currents may flow in a signal terminal of the DUT 100 as currents related to an inspection of the DUT 100. One current of the two types of currents is a leakage current flowing from the signal terminal of the DUT in a direction of a ground terminal or a power terminal of the DUT when the DUT is in a standby state, and the other current is an operating current flowing from the signal terminal in the direction of the ground terminal or the power terminal when the DUT is in an active state.

Measurement of First Leakage Current

First, when a current value, which will be obtained in the DUT 100, is a value of a leakage current flowing from the signal terminal of the DUT in a direction of the ground terminal thereof, a process of calculating the value of the leakage current is as follows.

The measurement of the current related to the inspection of the DUT 100 is performed in a state in which the signal terminal of the DUT 100 is connected to the current measurement apparatus according to the present invention with reference to FIG. 2 or 3.

1-1) First, a test pattern is applied to the DUT 100 to put the DUT 100 in a standby state. In this case, the switching element 250 or 350 is in an OFF state.

1-2) Next, when the controller 236 or 336 instructs the beginning of measurement, the input buffer of the I/O buffer 232 or 332 begins charging of the capacitor 210 or 310 until a voltage Vs of one end of the capacitor 210 or 310 reaches a voltage Vd of the power terminal of the DUT 100. In this case, in order to sufficiently charge the capacitor 210 or 310, a charging time is a time which is sufficiently larger than a time constant r of the charging circuit including the capacitor 210 or 310 and the I/O buffer 232 or 332. Here, the time constant t of the charging circuit is a value obtained by multiplying a capacitance Ck of the capacitor 210 or 310 by a charging drive resistance Ra of the input buffer, i.e., τ=Ck*Ra, and Ck is the capacitance of the capacitor and is a known design constant. Ra is the charging drive resistance of the input buffer of the I/O buffer 232 or 332. In general, a settling time during charging is known to be about four times, e.g., four to five times, the time constant.

The above-described processes 1-1) and 1-2) may be performed at the same time or at different times. When the processes 1-1) and 1-2) are performed at different times, a performing order may be such that the process 1-1) is performed and then the process 1-2) is performed, or the process 1-2) is performed and then the process 1-1) is performed. Hereinafter, since a description of a mutual order of processes corresponding to the above processes 1-1) and 1-2) in measurement of another current is the same as the above description, a duplicate description will be omitted herein.

1-3) After the charging time is elapsed, the controller 236 or 336 turns the input buffer of the I/O buffer 232 or 332 off and turns the output buffer on. In addition, the controller 236 or 336 closes the switching element 250 or 350 to turn the switching element 250 or 350 on so that the controller 236 or 336 connects the signal terminal of the DUT 100, which is a subject for the current measurement, to the current measurement apparatus according to the present invention and, simultaneously, instructs the time measurer 234 or 334 to measure a time.

1-4) From a moment at which the current measurement apparatus is connected to the signal terminal of the DUT 100, a variation in charged amount of charges in the capacitor 210 or 310 begins due to a leakage current. In this case, the output buffer of the I/O buffer 232 or 332 has two output logic values corresponding to 0 and 1 according to the voltage Vs of one end of the capacitor 210 or 310 so that an output logic value may be varied from 1 to 0 according to the variation in amount of charges of the capacitor.

When a variation occurs in the output logic value of the output buffer of the I/O buffer 232 or 332, the controller 236 or 336 instructs the time measurer 234 or 334 to measure an arrival time t which is elapsed from a time when the switching element 250 or 350 is turned on to a time when the output logic value is varied. As a general example, when a power supply voltage, which is the first voltage, is Vd, a reference voltage Vr, which is the second voltage at which the variation in output logic value of the output buffer occurs, may be determined as Vr=Vd/2. However, a setting of the reference voltage is not limited thereto.

Thus, the controller 236 or 336 may calculate the first leakage current of the DUT 100, which is the subject for the current measurement, using the following Equation 1 from the measured arrival time t.

$$i = C_k \left( \frac{V_d - V_r}{t} \right) = C_k \frac{V_d}{2t} \qquad \text{[Equation 1]}$$

Equation 1 is derived when the first voltage is Vd and the second voltage is Vr=Vd/2, and the skilled person will also easily obtain an equation for a current value corresponding to Equation 1 with respect to first and second voltages determined otherwise, and thus an unnecessary detailed description will be omitted herein.

Measurement of Second Leakage Current

Unlike the above description, when a current value, which will be obtained in the DUT 100, is a value of a leakage current flowing from the signal terminal of the DUT in a direction of the power terminal thereof, a process of calculating the value of the leakage current is as follows.

2-1) A process which is the same as the process 1-1) in the measurement of the first leakage current is performed.

2-2) Next, when the controller 236 or 336 instructs the beginning of measurement, the input buffer of the I/O buffer 232 or 332 begins discharging of the capacitor 210 or 310 until the voltage Vs of one end of the capacitor 210 or 310 reaches a voltage of the ground terminal of the DUT 100. In this case, in order to sufficiently discharge the capacitor 210 or 310, a discharging time is a time which is sufficiently larger than a time constant T of a discharging circuit including the capacitor 210 or 310 and the I/O buffer 232 or 332. Here, the time constant r of the discharging circuit is a value obtained by multiplying the capacitance Ck of the capacitor 210 or 310 by a discharging drive resistance Rb of the input buffer, i.e., i=Ck*Rb, and Ck is the capacitance of the capacitor and is the known design constant. Rb is the discharging drive resistance of the input buffer of the I/O buffer 232 or 332. In general, a settling time during discharging is also known to be about four times, e.g., four to five times, the time constant.

2-3) After the discharging time is elapsed, as in the process 1-3) in the measurement of the first leakage current, the controller 236 or 336 turns the input buffer of the I/O buffer 232 or 332 off and turns the output buffer on. In addition, the controller 236 or 336 closes the switching element 250 or 350 to turn the switching element 250 or 350 on so that the controller 236 or 336 connects the signal terminal of the DUT 100, which is the subject for the current measurement, to the current measurement apparatus according to the present invention and, simultaneously, instructs the time measurer 234 or 334 to measure a time.

2-4) From a moment at which the current measurement apparatus is connected to the signal terminal of the DUT 100, a variation in charged amount of charges in the capacitor 210 or 310 begins due to a leakage current. In this case, the output buffer of the I/O buffer 232 or 332 has two output logic values corresponding to 0 and 1 according to the voltage Vs of one end of the capacitor 210 or 310 so that an output logic value may be varied from 0 to 1 according to the variation in amount of charges of the capacitor.

When a variation occurs in the output logic value of the output buffer of the I/O buffer 232 or 332, the controller 236 or 336 instructs the time measurer 234 or 334 to measure an arrival time t which is elapsed from a time when the switching element 250 or 350 is turned on to a time when the output logic value is varied. Thus, the controller 236 or 336 may calculate the second leakage current of the DUT 100, which is the subject for the current measurement, using the following Equation 2 from the measured arrival time t.

$$i = C_k \frac{V_r}{t} = C_k \frac{V_d}{2t} \quad \text{[Equation 2]}$$

Like Equation 1, Equation 2 is illustrative, and the skilled person will also easily obtain an equation corresponding to Equation 2 with respect to first and second voltages determined otherwise.

Measurement of First Operating Current

Unlike the above description, when a current value, which will be obtained in the DUT 100, is a value of an operating current flowing from the signal terminal of the DUT in the direction of the ground terminal thereof, a process of calculating the value of the operating current is as follows.

3-1) A process which is the same as the process 1-1) in the measurement of the first leakage current is performed, and there is a difference in that a test pattern is a pattern which puts the DUT 100 in an active state instead of the standby state.

3-2) A process which is the same as the process 1-2) in the measurement of the first leakage current is performed.

3-3) A process which is the same as the process 1-3) in the measurement of the first leakage current is performed.

3-4) A process which is the same as the process 1-4) in the measurement of the first leakage current is performed, and there is a difference in that the operating current is considered instead of the leakage current.

Measurement of Second Operating Current

Unlike the above description, when a current value, which will be obtained in the DUT 100, is a value of an operating current flowing from the signal terminal of the DUT in the direction of the power terminal thereof, a process of calculating the value of the operating current is as follows.

4-1) A process which is the same as the process 2-1) in the measurement of the second leakage current is performed, and there is a difference in that a test pattern is a pattern which puts the DUT 100 in the active state instead of the standby state.

4-2) A process which is the same as the process 2-2) in the measurement of the second leakage current is performed.

4-3) A process which is the same as the process 2-3) in the measurement of the second leakage current is performed.

4-4) A process which is the same as the process 2-4) in the measurement of the second leakage current is performed, and there is a difference in that the operating current is considered instead of the leakage current.

Hereinbefore, the method of measuring (i) the value of the first leakage current flowing from the signal terminal of the DUT to the ground terminal thereof, (ii) the value of the second leakage current flowing from the signal terminal of the DUT to the power terminal thereof, (iii) the value of the first operating current flowing from the signal terminal of the DUT to the ground terminal thereof, and (iv) the value of the second operating current flowing from the signal terminal of the DUT to the power terminal thereof using the current measurement apparatus of the present invention has been described.

Meanwhile, the current measurement method described in the present invention is not limited to a condition in which the current measurement apparatus which essentially has the configuration according to the present invention is used so that a method will be described again as follows on the basis of the above-described current measurement method.

A method of measuring a value of a current related to an inspection of a DUT, which is a subject for current measurement, according to the present invention (hereinafter, referred to as a "current measurement method") is performed first in a state in which a signal terminal of the DUT is connected in parallel to a capacitor, a switching element is connected in series between one end of the capacitor and the signal terminal of the DUT, and the switching element is opened.

The current measurement method according to the present invention includes operation S410 (not shown) in which the current measurement apparatus (i) generates a test pattern to operate the DUT in a standby state or an active state or assists a test pattern generation apparatus interlocked with the current measurement apparatus to operate and (ii) increases or decreases the amount of charges of the capacitor through charging or discharging the capacitor such that the voltage of one end of the capacitor reaches a predetermined first voltage.

Next, the current measurement method of the present invention further includes operation S420 (not shown) in which, when the voltage of one end of the capacitor reaches the first voltage, the current measurement apparatus closes the switching element such that a variation in amount of charges of the capacitor begins.

Then, the current measurement method of the present invention further includes operation S430 (not shown) in which, when it is detected that the voltage of one end of the capacitor is varied to a predetermined second voltage, the current measurement apparatus obtains an arrival time which is a time elapsed from when the switching element is closed to when the variation reaches to the predetermined second voltage.

In an example of operation S430, the variation of the voltage of one end of the capacitor to the predetermined second voltage may be detected using an I/O buffer connected to one end of the capacitor which is connected to the signal terminal of the DUT. Here, the I/O buffer performs a function of outputting a signal corresponding to an output logic value according to the voltage of one end of the capacitor, and, owing to the function, when the voltage of one end of the capacitor reaches to the second voltage from the first voltage, the variation to the second voltage according to occurrence of a variation in the output logic value may be detected.

It will be understood by the skilled person that the I/O buffer described herein may be included in the current measurement apparatus according to the present invention or other current measurement apparatuses or used as a separate component.

Further, in the present embodiment, the acquisition of the arrival time may be performed by the time measurer for measuring, when the variation to the second voltage is detected from the controller, which controls the I/O buffer, or the I/O buffer, a time elapsed from when the switching element is closed to when the variation reaches to the second voltage.

Similarly, the time measurer described herein may be included in the current measurement apparatus according to the present invention or other current measurement apparatuses or used as a separate component.

As described above, the current measurement apparatus and the current measurement method are illustrative and the skilled person will achieve implementation of various modifications with reference to the contents described herein.

Meanwhile, in all the embodiments of the present invention, in order to adjust precision of the measurement of the current value of the DUT 100, at least one of the capacitance of the capacitor 210 or 310 and a measurement frequency of the time measurer 234 or 334 may be variable.

For example, as the capacitance of the capacitor increase and the measurement frequency becomes higher, the accuracy of the measurement increases. However, when the capacitance of the capacitor increases excessively, the measurement time may relatively increase so that it may be necessary to maintain an appropriate level.

For example, when a semiconductor device, of which a voltage of a power terminal is 1.0 V, is a DUT and capacitance of the capacitor is set to 1 nF and a measurement frequency of the time measurer is set to 1 GHz while a 1 nA leakage current of the DUT is measured, a time required for measurement is 0.5 seconds from $t=C*(Vd-Vd/2)/i$, and the number of clocks required for the measurement is $5*10^8$. In other words, since the current value corresponding to one clock becomes accuracy during measurement, it is possible to measure up to $10^{-8}$ nA on the basis of the above-described setting criteria.

In the above-described example, when the measurement time is excessive to be burdened, it is necessary to optimize the measurement time by appropriately adjusting the capacitance of the capacitor. To this end, the capacitor may be comprised of a variable element of which capacitance may be adjusted.

As another example, it is also possible to implement a method of measuring a current by setting the capacitance of the capacitor of the current measurement apparatus according to the present invention to "0" and using internal inherent capacitance components of the DUT, which is a subject for measurement, and a circuit part of the current measurement apparatus. A capacitance capacity of an I/O terminal of a general semiconductor element ranges from 5 to 10 pF. In this case, a measurement time is about 1/100 seconds.

As still another example, it is possible to implement a method of detecting a minute variance in amount of charges of the capacitor to increase precision or reduce a measurement time by replacing the output buffer of the I/O buffer with a precision component such as a high-speed analog-to-digital converter (ADC) or an operational amplifier (OP Amp) in the current measurement apparatus according to the present invention. When the output buffer in the above-described embodiment is used, the output logic value of the output buffer is changed when a time during which a variation in voltage of one end of the capacitor reaches a level of Vd/2 elapses, whereas, when such a precision component is used, even a fine level of 1 mV may immediately result in a variation in the output logic value. When capacitance applied to the signal terminal of the DUT is large due to a design, such a precision component is applied such that it is possible to achieve significant reduction in measurement time.

As described above, a method of measuring a current using time measurement elements is employed in all the embodiments of the present invention. Thus, the present invention does not rely on precision of the expensive precision devices constituting hardware as in the conventional method or does not employ large parts such as coils, resistors, and the like such that there is an effect in that a unit cost can be reduced and miniaturization is possible.

In the conventional measurement of a current using a coil, a resistor, and the like, since the coil, the resistor, and the like should be inserted in series in a direction of a power supply or a ground from a terminal of a DUT such as a semiconductor circuit or an electronic circuit module, which will be measured, modification of an electronic circuit in the DUT is necessary, whereas, another advantage of the technique described herein as the above embodiments is that, according to the current measurement apparatus or the current measurement method of the present invention, a terminal of the measurement module is brought into contact with the terminal of the DUT, which will be measured, without modification of the electronic circuit such that a current may be measured.

On the basis of the description of the above embodiments, the skilled person in the corresponding art will clearly appreciate that the effect of the present invention may be achieved by only hardware of the above-described current measurement apparatus 200 or 300, achieved through a combination of the hardware and software, or achieved by only hardware. The skilled person will appreciate well that a subject of the technical solution of the present invention or portions contributing to the related art can be realized as various modifications.

While the present invention has been described with reference to specific items such as particular components, exemplary embodiments, and drawings, these are merely provided to help understanding the present invention, and the present invention is not limited to these embodiments, and those skilled in the art to which the present invention pertains can variously alter and modify from the description of the present invention.

Therefore, the spirit of the present invention should not be limited to the above-described embodiments, and it should be construed that the appended claims as well as all equivalents or equivalent modifications of the appended claims will fall within the scope of the present invention.

Such equivalents or equivalent modifications will include, for example, methods which are mathematically or logically equivalent to the method according to the present invention and are capable of producing the same results as those when the method according to the present invention is practiced.

DESCRIPTION OF REFERENCE NUMERALS

100: Device under test (DUT)
210 and 310: Capacitors
220 and 320: Test pattern generation apparatuses
230 and 330: Measurement modules
232 and 332: Input/output buffers
234 and 334: Time measurers
236 and 336: Controllers
240 and 340: Protection circuits
250 and 350: Switching elements

What is claimed is:
1. A current measurement apparatus comprising:
a capacitor connected in parallel to a signal terminal of a device under test (DUT) which is a subject for current measurement;

a test pattern generation apparatus configured to generate a test pattern to operate the DUT; and a measurement module connected to one end of the capacitor which is connected to the signal terminal of the DUT, wherein the measurement module includes:

an input/output (I/O) buffer configured to increase or decrease an amount of charges of the capacitor through charging or discharging the capacitor and output a signal corresponding to an output logic value according to a voltage of one end of the capacitor;

a time measurer configured to measure an arrival time which is a time during which the voltage of one end of the capacitor reaches a predetermined second voltage from a predetermined first voltage; and a controller configured to control the I/O buffer and the time measurer to measure the arrival time and measure a value of a current related to an inspection of the DUT using the arrival time.

2. The current measurement apparatus of claim 1, wherein the measurement module measures at least one among (i) a value of a first leakage current flowing from the signal terminal of the DUT to a ground terminal thereof, (ii) a value of a second leakage current flowing from the signal terminal of the DUT to a power terminal thereof, (iii) a value of a first operating current flowing from the signal terminal of the DUT to the ground terminal thereof, and (iv) a value of a second operating current flowing from the signal terminal of the DUT to the power terminal thereof using a calculation on the basis of capacitance of the capacitor, the first voltage, the second voltage, and the arrival time as the value of the current related to the inspection of the DUT.

3. The current measurement apparatus of claim 2, wherein the test pattern generation apparatus generates a first test pattern for maintaining the DUT in a standby state in which at least one of the first leakage current and the second leakage current is measurable or generates a second test pattern for maintaining the DUT in an active state in which at least one of the first operating current and the second operating current is measurable.

4. The current measurement apparatus of claim 3, wherein the first voltage includes a voltage at which one end of the capacitor reaches when a driving voltage of the I/O buffer is applied to the capacitor for a time obtained by multiplying a time constant of a charging circuit including the capacitor and the I/O buffer by a predetermined positive number.

5. The current measurement apparatus of claim 2, wherein the first voltage includes a voltage at which one end of the capacitor reaches when a driving voltage of the I/O buffer is applied to the capacitor for a time obtained by multiplying a time constant of a charging circuit including the capacitor and the I/O buffer by a predetermined positive number.

6. The current measurement apparatus of claim 1, wherein the first voltage includes a voltage at which one end of the capacitor reaches when a driving voltage of the I/O buffer is applied to the capacitor for a time obtained by multiplying a time constant of a charging circuit including the capacitor and the I/O buffer by a predetermined positive number.

7. The current measurement apparatus of claim 1, wherein the I/O buffer is configured such that the first voltage and the second voltage are settable, and, when the voltage of one end of the capacitor reaches to the second voltage from the first voltage, the I/O buffer causes a variation in the output logic value to occur so that the time measurer detects the variation and the I/O buffer instructs the time measurer to measure the arrival time.

8. The current measurement apparatus of claim 1, further comprising a switching element connected in series between one end of the capacitor connected in parallel to the measurement module and the signal terminal of the DUT, wherein the controller opens or closes the switching element according to a start time of the charging or discharging.

9. The current measurement apparatus of claim 1, further comprising a protection circuit connected in parallel to one end of the capacitor and the measurement module, wherein the protection circuit is a circuit for protecting the current measurement apparatus from an overcurrent or an electric shock.

10. The current measurement apparatus of claim 1, wherein at least one of capacitance of the capacitor and a measurement frequency of the time measurer is variable so as to adjust precision of measurement for the value of the current of the DUT.

11. The current measurement apparatus of claim 1, wherein the measurement module is formed such that the I/O buffer and the time measurer are monolithically integrated into the controller.

12. A measurement module, which is connected to one end of a capacitor connected to a signal terminal of a device under test (DUT) to measure a value of a current related to an inspection of the DUT, which is a subject for current measurement, in a state in which the signal terminal of the DUT is connected in parallel to the capacitor and the DUT operates due to a test pattern, the measurement module comprising:

an input/output (I/O) buffer configured to increase or decrease an amount of charges of the capacitor through charging or discharging the capacitor and output a signal corresponding to an output logic value according to a voltage of one end of the capacitor;

a time measurer configured to measure an arrival time which is a time during which the voltage of one end of the capacitor reaches a predetermined second voltage from a predetermined first voltage; and a controller configured to control the I/O buffer and the time measurer to measure the arrival time and measure the value of the current related to the inspection of the DUT using the arrival time.

13. A method of measuring a value of a current related to an inspection of a device under test (DUT), which is a subject for the current measurement, using a current measurement apparatus, the method comprising:

(a) in a state in which a signal terminal of the DUT is connected in parallel to a capacitor, a switching element is connected in series between one end of the capacitor and the signal terminal of the DUT, and the switching element is opened, (i) generating, by the current measurement apparatus, a test pattern to operate the DUT in a standby state or an active state or assisting a test pattern generation apparatus interlocked with the current measurement apparatus to operate and (ii) increasing or decreasing, by the current measurement apparatus, the amount of charges of the capacitor through charging or discharging the capacitor such that a voltage of one end of the capacitor reaches a predetermined first voltage;

(b) when the voltage of one end of the capacitor reaches the first voltage, closing, by the current measurement apparatus, the switching element such that a variation in amount of charges of the capacitor begins;

(c) when it is detected that the voltage of one end of the capacitor is varied to a predetermined second voltage, obtaining, by the current measurement apparatus, an arrival time which is a time elapsed from when the switching element is closed to when the variation reaches to the predetermined second voltage; and (d) measuring, by the current measurement apparatus, the value of the current related to the inspection of the DUT using the arrival time.

14. The current measurement method of claim 13, wherein:

in operation (c), the variation of the voltage of one end of the capacitor to the predetermined second voltage is detected using an I/O buffer connected to the one end of the capacitor connected to the signal terminal of the DUT; and the I/O buffer outputs a signal corresponding to an output logic value according to the voltage of one end of the capacitor and detects, when the voltage of one end of the capacitor reaches the second voltage from the first voltage, a variation to the second voltage is detected as a variation in the output logic value occurs.

15. The current measurement method of claim 14, wherein the acquisition of the arrival time is performed by a time measurer for measuring, when the variation to the second voltage is detected from a controller, which controls the I/O buffer, or the I/O buffer, a time elapsed from when the switching element is closed to when the variation reaches to the second voltage.

16. The current measurement method of claim 13, wherein the value of the current related to the inspection of the DUT includes at least one among (i) a value of a first leakage current flowing from the signal terminal of the DUT to a ground terminal thereof, (ii) a value of a second leakage current flowing from the signal terminal of the DUT to a power terminal thereof, (iii) a value of a first operating current flowing from the signal terminal of the DUT to the ground terminal thereof, and (iv) a value of a second operating current flowing from the signal terminal of the DUT to the power terminal thereof, which are calculated on the basis of capacitance of the capacitor, the first voltage, the second voltage, and the arrival time.

* * * * *